United States Patent
Thompson

(10) Patent No.: US 9,040,127 B2
(45) Date of Patent: May 26, 2015

(54) LOW TEMPERATURE SILICON CARBIDE DEPOSITION PROCESS

(75) Inventor: David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 551 days.

(21) Appl. No.: 13/189,642

(22) Filed: Jul. 25, 2011

(65) Prior Publication Data

US 2012/0177841 A1    Jul. 12, 2012

Related U.S. Application Data

(60) Provisional application No. 61/386,116, filed on Sep. 24, 2010.

(51) Int. Cl.
| | | |
|---|---|---|
| *H05H 1/24* | (2006.01) | |
| *H01L 21/02* | (2006.01) | |
| *C23C 16/32* | (2006.01) | |
| *C23C 16/455* | (2006.01) | |
| *C23C 16/00* | (2006.01) | |

(52) U.S. Cl.
CPC ........ *H01L 21/02658* (2013.01); *C23C 16/325* (2013.01); *C23C 16/4554* (2013.01); *C23C 16/45553* (2013.01); *H01L 21/0237* (2013.01); *H01L 21/02529* (2013.01); *H01L 21/0262* (2013.01)

(58) Field of Classification Search
USPC ...................................... 427/577, 248.1, 569
See application file for complete search history.

(56) References Cited

U.S. PATENT DOCUMENTS

| | | | |
|---|---|---|---|
| 5,846,332 A | 12/1998 | Zhao et al. | |
| 6,106,625 A | 8/2000 | Koai et al. | |
| 6,117,233 A | 9/2000 | Bill et al. | |
| 6,878,206 B2 | 4/2005 | Tzu et al. | |
| 6,916,398 B2 | 7/2005 | Chen et al. | |
| 7,198,820 B2* | 4/2007 | Harkonen et al. | 427/249.17 |
| 7,204,886 B2 | 4/2007 | Chen et al. | |
| 7,399,357 B2* | 7/2008 | Sherman | 117/92 |
| 7,410,671 B2* | 8/2008 | Sherman | 427/255.37 |
| 7,780,785 B2 | 8/2010 | Chen et al. | |
| 2005/0284370 A1 | 12/2005 | Strang et al. | |
| 2006/0079090 A1 | 4/2006 | Elers et al. | |
| 2007/0148350 A1* | 6/2007 | Rahtu et al. | 427/249.17 |
| 2010/0003406 A1 | 1/2010 | Lam et al. | |

FOREIGN PATENT DOCUMENTS

JP    2006/009152    1/2006

OTHER PUBLICATIONS

"International Search Report and Written Opinion of PCT/US2011/045164", mailed on Mar. 13, 2012, 11 pages.

* cited by examiner

*Primary Examiner* — Kelly M Gambetta
(74) *Attorney, Agent, or Firm* — Servilla Whitney LLC

(57) ABSTRACT

Methods for formation of silicon carbide on substrate are provided. Atomic layer deposition methods of forming silicon carbide are described in which a first reactant gas of the formula $Si_nH_aX_b$ wherein n=1-5, a+b=2n+2, a>0, and X=F, Cl, Br, I; and a second reactant gas of the formula $MR_{3-b}Y_b$, wherein R is a hydrocarbon containing substituent, Y is a halide, hydride or other ligand and b=1-3 are sequentially deposited on a substrate and then exposed to a plasma. The process can be repeated multiple times to deposit a plurality of silicon carbide layers.

20 Claims, 3 Drawing Sheets

LOW TEMPERATURE SILICON CARBIDE DEPOSITION PROCESS

BACKGROUND

Embodiments of the present invention generally relate to processes for the deposition of silicon carbide. Specific embodiments pertain to low temperature deposition processes, for example by atomic layer deposition.

Silicon carbide ($Si_xC_yH_z$) and similar films are promising materials for a variety of applications. For example, in semiconductor devices some compositions of $Si_xC_yH_z$ functions at high temperature, high voltage and high frequency without degradation. Excellent mechanical, chemical, and electrical capabilities also make silicon carbide an attractive material in microelectromechanical systems (MEMS). Silicon carbide is considered an attractive material for EUV and soft X-ray optics, passivation layers in solar cells and A variety of techniques are used for deposition of silicon carbide thin films, including traditional chemical vapor deposition (CVD) and plasma enhanced CVD (PECVD). Improvements in existing processes as well as new deposition processes at low temperature deposition processes are desired.

SUMMARY OF THE INVENTION

One embodiment of the present invention relates to a method for forming a silicon carbide material on a substrate surface comprising: exposing a substrate sequentially to a first reactant gas of the formula $Si_nH_aX_b$ wherein n=1-5, a+b=2n+2, and a>0, and X=F, Cl, Br, I; and a second reactant gas of the formula $MR_{3-b}Y_b$, wherein M is an element selected from Group III of the period table, such as an element from Group IIIb (also referred to as Group 13), R is a hydrocarbon containing substituent, Y is a halide, hydride or other ligand and b=1-3 to form a silicon carbide layer containing excess hydrogen on the substrate during an atomic layer deposition process; exposing the substrate having a silicon carbide layer to a treatment process to remove at least some of the excess hydrogen; and repeating sequentially the atomic layer deposition process and the treatment process.

In an embodiment, the treatment process includes a heat treatment process, and the atomic layer deposition process and treatment process are conducted below 600° C. In an embodiment, the treatment process includes a plasma treatment process, and the atomic layer deposition process and treatment process are conducted below 600° C.

Another embodiment pertains to a method for forming a silicon carbide material on a substrate surface, comprising: exposing a substrate sequentially to a silicon tetrachloride reactant gas and a trimethylaluminum (TMA) reactant gas to form a silicon carbide layer on the substrate during an atomic layer deposition process; exposing the silicon carbide layer to at least one of a heat treatment and a plasma during a treatment process; and repeating sequentially the atomic layer deposition process and the treatment. The method may include exposing the substrate to a purge gas during a purge process. In specific embodiments, the purge process is conducted after exposure of the substrate to the silicon tetrachloride reactant gas, exposure of the substrate to the TMA reactant gas, and the treatment process. In one or more embodiments, the purge gas is selected from an inert gas, for example nitrogen, argon and combinations thereof. In one embodiment, the atomic layer deposition process is performed in a process chamber and the plasma is generated remotely from the process chamber. In an embodiment, a single process cycle comprises exposing a substrate to the silicon tetrachloride reactant gas; a first purge process after exposing the substrate to the silicon tetrachloride reactant gas; exposing the substrate to the TMA reactant gas to form a silicon carbide layer on the substrate; a second purge process after exposing the substrate to the TMA reactant gas; and the treatment process. An embodiment may include repeating the single process cycle. An embodiment may include, prior to the atomic layer deposition process, treating the substrate to provide an active site on the substrate.

Another embodiment pertains to a method of forming a silicon carbide material on a substrate surface, comprising (a) disposing a substrate within a process chamber; (b) flowing silicon tetrachloride gas to the substrate within the chamber under conditions which form a monolayer on the substrate, the monolayer comprising silicon terminated with chlorine; (c) purging the process chamber; (d) flowing trimethylaluminum (TMA) gas to the substrate under conditions in which methyl groups exchange with chlorine and to provide a hydrogen rich layer; (e) purging the process chamber; (f) exposing the substrate to at least one of a heat treatment and a plasma treatment to reduce hydrogen in the hydrogen rich layer; (g) purging the process chamber; and repeating steps (b) through (g). In an embodiment, the plasma is formed remotely from the process chamber. In an embodiment, the plasma is hydrogen plasma or an inert gas plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
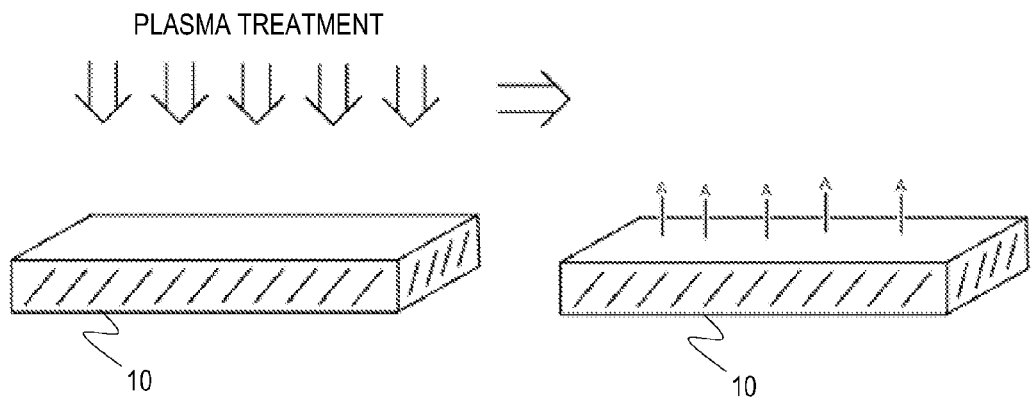
FIGS. 1A-E are a depiction of a sequential process for depositing a silicon tetrachloride layer on a substrate.

Embodiments of the invention generally provide silicon carbide deposition processes. In one embodiment, the silicon carbide deposition process is performed at a low temperature, which refers to a temperature below about 600° C. In specific embodiments, low temperature refers to temperatures below about 550° C., 500°, 450° C., 400° C., 350° C., 300° C., 250° C., 200° C., 150° C., 100° C., or in the range of 50° C. to about 100° C., for example in the range of about 70° C. to 90° C. In one embodiment, silicon carbide deposition is performed using an atomic layer deposition (ALD) process, and in specific embodiments, the ALD process is performed at a low temperature.

As used herein, "silicon carbide" is not limited to stoichiometric SiC Thus, "silicon carbide" refers to compounds of the formula $Si_xC_yH_z$, where x exceeds 0 and is less than 2, y exceeds 0 and is less than 2, and z is in the range of 0 and 16. Similarly, "silicon tetrachloride" is not limited to stoichiometric $SiCl_4$, and "silicon tetrachloride" refers to compounds of the formula $SiH_{4-a}Cl_a$ wherein a=1-4. In broader aspects of the invention, other mixed silane halides or halosilanes can be used as reactants. "Mixed silane halides" or "halosilanes" refers to compounds of the formula $Si_nH_aX_b$ wherein n=1-5, a+b=2n+2, a>0, and X=F, Cl, Br, I. In one or more embodiments of the invention, $MR_{3-b}Y_b$ is an organometal compound, such as a compound wherein M is aluminum, R is any hydrocarbon containing substituent (e.g., methyl or ethyl), and Y is any halide (e.g., F, Cl, Br, I), hydride or other ligand and b=1-3. In specific embodiments, TMA is used as an aluminum containing reactant.

According to one or more embodiments, silicon carbide films can be used in a variety of applications, including etch stops and sacrificial films with different etch selectivity than $SiN/SiO_2$. Such sacrificial films can be used in self aligned double patterning lithography schemes.

Atomic layer deposition is a deposition technique used to form thin films on a substrate, for example a semiconductor substrate, and may be used to form features in the manufacturing process of circuit devices. A thin film is grown layer by layer by exposing a surface of the substrate disposed in a process chamber to alternating pulses of reactants or chemical precursors, each of which undergoes a reaction, generally providing controlled film thickness. Each reactant pulse provides an additional atomic layer to previously deposited layers. In an embodiment, a film growth cycle generally consists of two pulses, each pulse being separated by a purge. The process chamber can be purged with an inert gas to remove the reactant or precursor material. When second reactant or precursor material is pulsed into the reactor, the second reactant or precursor material reacts with the precursor material on the wafer surface. The reactor is purged again with an inert gas. In an ALD manufacturing process, the thickness of the deposited film is controlled by the number of cycles.

Atomic layer deposition may also be referred to as cyclical deposition, referring to the sequential introduction of two or more reactive compounds to deposit a layer of material on a substrate surface. The two or more reactive compounds are alternatively introduced into a reaction zone or process region of a processing chamber. The reactive compounds may be in a state of gas, plasma, vapor, fluid or other state of matter useful for a vapor deposition process. Usually, each reactive compound is separated by a time delay to allow each compound to adhere, adsorb, absorb and/or react on the substrate surface. In one aspect, a first precursor or compound A is pulsed into the reaction zone followed by a first time delay. Next, a second precursor or compound B is pulsed into the reaction zone followed by a second delay. Compound A and compound B react to form a deposited material. During each time delay, a purge gas is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle. A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, fluid during the vapor deposition process. Also, a process may contain a purge gas or a carrier gas and not contain a reactive compound.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

Embodiments of the invention provide a method for depositing or forming silicon carbide on a substrate during a vapor deposition process, such as atomic layer deposition, plasma-enhanced ALD (PE-ALD), chemical vapor deposition (CVD), or plasma-enhanced CVD (PE-CVD). A processing chamber is configured to expose the substrate to a sequence of gases and/or plasmas during the vapor deposition process.

In one or more embodiments, the ALD or PE-ALD processes includes sequentially exposing a substrate to various deposition gases containing chemical precursors or reactants including a first reactant gas containing compounds of the formula $Si_nH_aX_b$ wherein n=1-5, a+b=2n+2, and a>0 and X=F, Cl, Br, I and a second reactant gas containing an organometal compound of the formula $MR_{3-b}Y_b$, wherein M is an element selected from Group III of the period table, including a Group IIIb (Group 13) element such as boron, aluminum or gallium, R is any hydrocarbon containing substituent (e.g., methyl or ethyl), Y is any halide (e.g., F, Cl, Br, I), hydride or other ligand and b=1-3, and then treating the substrate with a heat treatment or plasma, for example, a hydrogen plasma or an inert gas plasma such as a nitrogen plasma or argon plasma.

In some embodiments described herein, the ALD or PE-ALD processes include sequentially exposing a substrate to various deposition gases containing chemical precursors or reactants including silicon tetrachloride and trimethylaluminum (TMA), and then treating the substrate with a heat treatment or plasma, for example, a hydrogen plasma or an inert gas plasma such as a nitrogen plasma or argon plasma.

In one embodiment, a silicon carbide material may be formed on the substrate surface by sequentially exposing the substrate to a silicon precursor gas comprising silicon tetrachloride and carbon precursor gas comprising TMA and exposing the surface to a plasma, for example a hydrogen plasma or inert gas plasma such as nitrogen or argon plasma. The process results in the formation of the silicon carbide layer. In a specific embodiment of a process sequence, a substrate is exposed to silicon tetrachloride in a process chamber. The process chamber is then purged. Next, the substrate is exposed to TMA, and the process chamber is purged again. The substrate is then exposed to a hydrogen or inert gas plasma, completing a process cycle that forms a layer. The process cycle can be repeated any number of times to increase the thickness of the layer. The substrate containing one or more silicon carbide layers optionally may be heated.

The reactants are typically in vapor or gas form. The reactants may be delivered with a carrier gas. A carrier gas, a purge gas, a deposition gas, or other process gas may contain nitrogen, hydrogen, argon, neon, helium, or combinations thereof.

Plasmas may be useful for depositing, forming, annealing, treating, or other processing of silicon carbide materials described herein. The various plasmas described herein, such as the nitrogen plasma or the inert gas plasma, may be ignited from and/or contain a plasma reactant gas. The plasma reactant gas may contain nitrogen, hydrogen, argon, neon, helium, or combinations thereof. In some examples, the nitrogen plasma contains nitrogen and hydrogen.

The various gases for the process may be pulsed into an inlet, through a gas channel, from various holes or outlets, and into a central channel. Silicon tetrachloride gas may be pulsed into the inlets, through gas the channel, from the holes and outlets, and into the central channel. Likewise, TMA gas may be pulsed into the inlets, through the gas channel, from the holes and outlets, and into the central channel. An inert gas or hydrogen plasma is sequentially pulsed from a remote plasma source into the central channel from an inlet. The deposition gas containing silicon tetrachloride, TMA and plasma may be sequentially pulsed to and through a showerhead In another embodiment, a silicon carbide material may be formed during another PE-ALD process that provides sequential pulses of a silicon tetrachloride, TMA and plasma (e.g., nitrogen plasma). In these embodiments, the reagents are generally ionized during the process. The PE-ALD process provides that the plasma is generated external from the processing chamber, such as by a remote plasma generator system. During PE-ALD processes, a plasma may be generated from a microwave (MW) frequency generator or a radio frequency (RF) generator.

In some embodiments, a plasma system and a processing chambers or systems which may be used during methods described here for depositing or forming silicon carbide materials include the TXZ® CVD, chamber available from Applied Materials, Inc., located in Santa Clara, Calif. Further disclosure of plasma systems and processing chambers is described in commonly assigned U.S. Pat. Nos. 5,846,332, 6,079,356, and 6,106,625. In other embodiments, a PE-ALD processing chamber or system which may be used during methods described here for depositing or forming silicon carbide materials is described in commonly assigned U.S. Ser. No. 12/494,901, filed on Jun. 30, 2009, published as United States patent application publication number 20100003406. An ALD processing chamber used in some embodiments described herein may contain a variety of lid assemblies. Other ALD processing chambers may also be used during some of the embodiments described herein and are available from Applied Materials, Inc., located in Santa Clara, Calif. A detailed description of an ALD processing chamber may be found in commonly assigned U.S. Pat. Nos. 6,878,206, 6,916,398, and 7,780,785. In another embodiment, a chamber configured to operate in both an ALD mode as well as a conventional CVD mode may be used to deposit silicon carbide materials is described in commonly assigned U.S. Pat. No. 7,204,886.

The ALD process provides that the processing chamber or the deposition chamber may be pressurized at a pressure within a range from about 0.01 Torr to about 80 Torr, for example from about 0.1 Torr to about 10 Torr, and more specifically, from about 0.5 Torr to about 2 Torr. Also, according to one or more embodiments, the chamber or the substrate may be heated to a temperature of less than about 600° C., for example, about 400° C. or less, such as within a range from about 200° C. to about 400° C., and in other embodiments less than about 300° C., less than about 200° C., or less than about 100°, for example in the range of about 50° C. and 100° C., such as in the range of about 70° C. and 90° C.

An exemplary embodiment of an atomic layer deposition process cycle will now be described.

Preparation of Substrate

Referring first to FIG. 1A, an optional process step involves preparation of a substrate 10 which has been treated with a plasma or other suitable surface treatment to provide active sites "A" on the surface of the substrate. Examples of suitable active sites include, but are not limited to, —H terminated and —OH terminated active sites.

Delivery of Silicon-Containing Reactant Gas to Substrate Surface

Figure 1B:
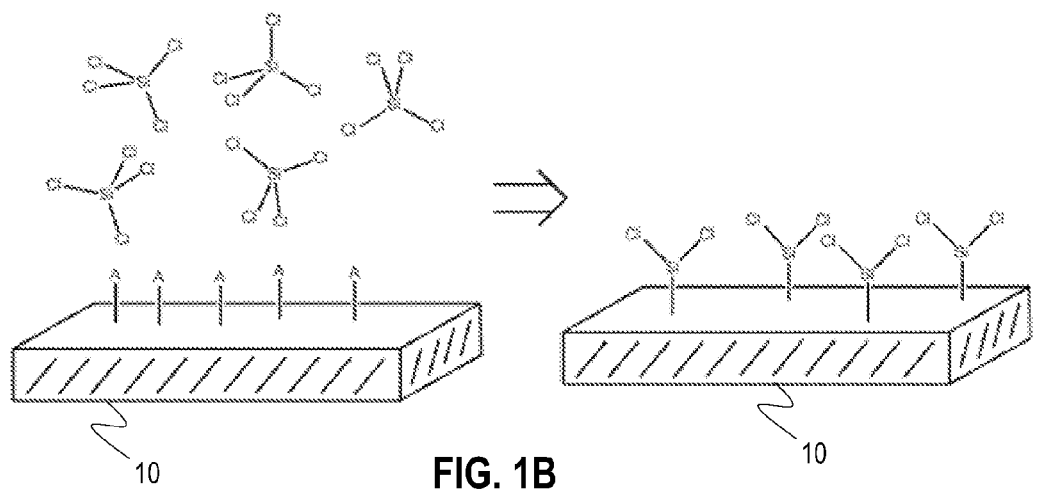

The substrate 10 having active sites can be exposed to a first, silicon-containing reactant gas described above. In a specific embodiment, silicon tetrachloride reactant gas or vapor formed by passing a carrier gas (for example, nitrogen or argon) through an ampoule of silicon tetrachloride. The ampoule may be heated. The silicon tetrachloride reactant gas can be delivered at any suitable flow rate within a range from about 100 sccm to about 2,000 sccm, for example, from about 200 sccm to about 1,000 sccm, and in specific embodiments, from about 300 sccm to about 700 sccm, for example, about 500 sccm. The substrate may be exposed to the reactant gas containing the silicon tetrachloride for a time period within a range from about 0.1 seconds to about 8 seconds, for example, from about 1 second to about 5 seconds, and in a specific example, from about 2 seconds to about 4 seconds. The flow of the silicon tetrachloride reactant gas can be stopped once the silicon tetrachloride is adsorbed on the substrate. As shown in FIG. 1B, silicon with chlorine-terminated active sites is now associated with the substrate 10 surface.

First Purge

The substrate and chamber may be exposed to a purge step after stopping the flow of the silicon-containing reactant gas. A purge gas may be administered into the processing chamber with a flow rate within a range from about 100 sccm to about 2,000 sccm, for example, from about 200 sccm to about 1,000 sccm, and in a specific example, from about 300 sccm to about 700 sccm, for example, about 500 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 2 seconds to about 4 seconds. The carrier gas, the purge gas, the deposition gas, or other process gas may contain nitrogen, hydrogen, argon, neon, helium, or combinations thereof. In one example, the carrier gas contains nitrogen.

Delivery of Aluminum Containing Reactant Gas to Substrate Surface

The substrate having chlorine-terminated active sites can be exposed to a second, aluminum containing reactant gas as described above. In a specific embodiment, the substrate having chlorine-terminated active sites can be exposed to TMA reactant gas or vapor formed by passing a carrier gas (for example, nitrogen or argon) through an ampoule of TMA. The ampoule may be heated. The TMA reactant gas can be delivered at any suitable flow rate within a range from about 100 sccm to about 2,000 sccm, for example, from about 200 sccm to about 1,000 sccm, and in specific embodiments, from about 300 sccm to about 700 sccm, for example, about 500 sccm. The substrate may be exposed to the reactant gas containing the TMA for a time period within a range from about 0.1 seconds to about 8 seconds, for example, from about 1 second to about 5 seconds, and in a specific example, from about 2 seconds to about 4 seconds. The flow of the TMA reactant gas may be stopped once TMA is adsorbed on the substrate. As shown in FIG. 10, the chloride groups on the silicon can be exchanged with the methyl groups on the trimethylaluminum (TMA). The individual TMA molecules may become completely substituted with Cl groups or only partially substituted (Me3-xAlClx. The groups remaining on the surface may be made up of Si—CH3, Si—C—Si or other groups in between. The resulting surface is SiC/CH/CH$_3$ terminated with Me$_{3-x}$AlCl$_x$ as a byproduct. This may occur by sigma bond metathesis type reactions.

Second Purge

The substrate and chamber may be exposed to a purge step after stopping the flow of the second, aluminum containing reactant gas. A purge gas may be administered into the processing chamber with a flow rate within a range from about 100 sccm to about 2,000 sccm, for example, from about 200 sccm to about 1,000 sccm, and in a specific example, from about 300 sccm to about 700 sccm, for example, about 500 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 2 seconds to about 4 seconds. The carrier gas, the purge gas, the deposition gas, or other process gas may contain nitrogen, hydrogen, argon, neon, helium, or combinations thereof. In one example, the carrier gas contains nitrogen.

Plasma and/or Thermal Treatment

Figure 1C:
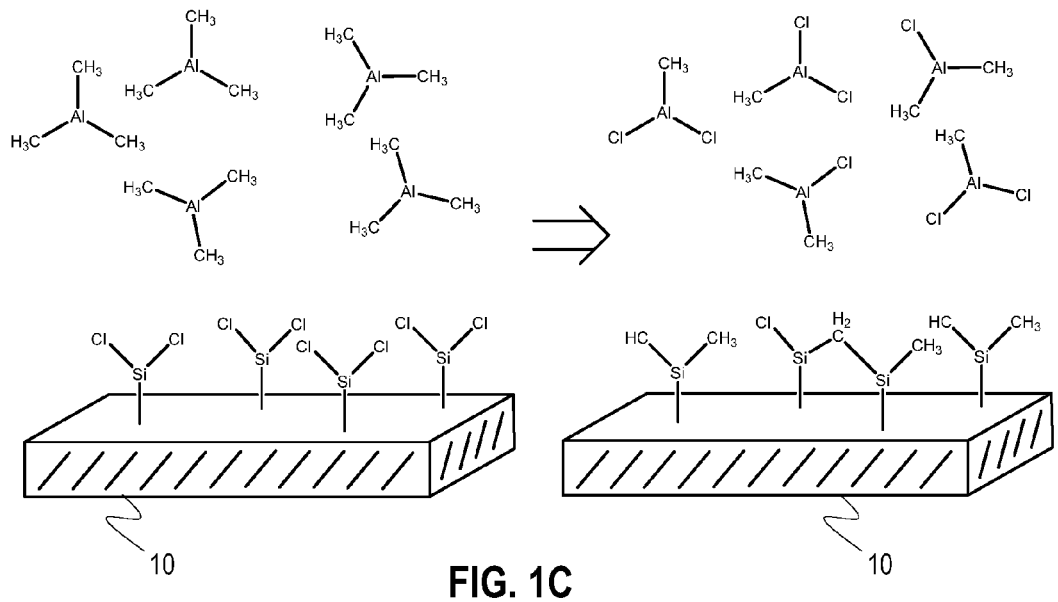
Figure 1D:
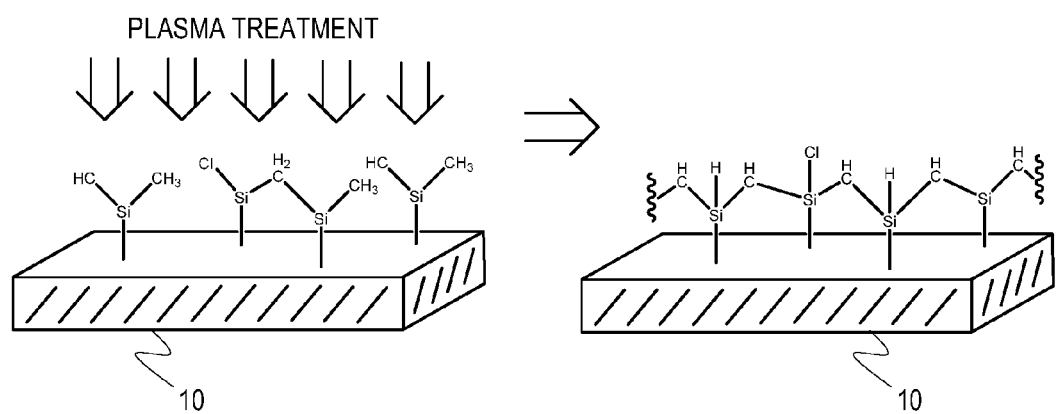

The substrate may optionally be treated by one or more of a thermal exposure or exposure to a plasma for a time period within a range from about 0.1 seconds to about 20 seconds, for example, from about 1 second to about 10 seconds, and in a specific example, from about 2 seconds to about 8 seconds to modify film characteristics. In one example, the plasma may include nitrogen, hydrogen, or combinations thereof to form a nitrogen plasma, a hydrogen plasma, or a combined plasma. In one or more embodiments, the plasma is generated at variable power during either or both of the precursor/reactant pulses. Referring to FIG. 1D, the plasma interacts with the TMA precursor on the substrate, and the plasma treated surface has fewer C—H groups and more bridging Si—C—Si groups than shown in FIG. 1C. Thus, plasma treatment and/or thermal treatment removes at least some of the excess hydrogen on the surface and also creates bridging carbide/carbon groups.

Alternatively, or in addition to the plasma treatment, the substrate can be thermally treated to remove at least some of the excess hydrogen. Suitable thermal treatments should be conducted below about 600° C., such as below about 550° C., 500°, 450° C., 400° C., 350° C., 300° C., 250° C., 200° C., 150° C., 100° C., or in the range of 50° C. to about 100° C., for example in the range of about 70° C. to 90° C.

In one embodiment, the ALD cycle (silicon-containing reactant gas (e.g., tetrachloride deposition) pulse, purge, aluminum-containing reactant gas (e.g., TMA) pulse, purge, and/or plasma exposure) can be repeated until a predetermined thickness of the silicon carbide is deposited on the substrate. The silicon carbide material may be deposited with a thickness less than about 1,000 Angstroms, for example preferably less than 500 Angstroms, and in a specific example from about 10 Angstroms to about 100 Angstroms, for example, about 30 Angstroms. However, the final thickness of the material will ultimately depend on the desired application or use of the silicon carbide material. The processes as described herein can deposit silicon carbide at a rate of at least about 0.15 Angstroms/cycle, for example, at least about 0.25 Angstroms/cycle, more preferably, at least about 0.35 Angstroms/cycle or faster.

Figure 1E:
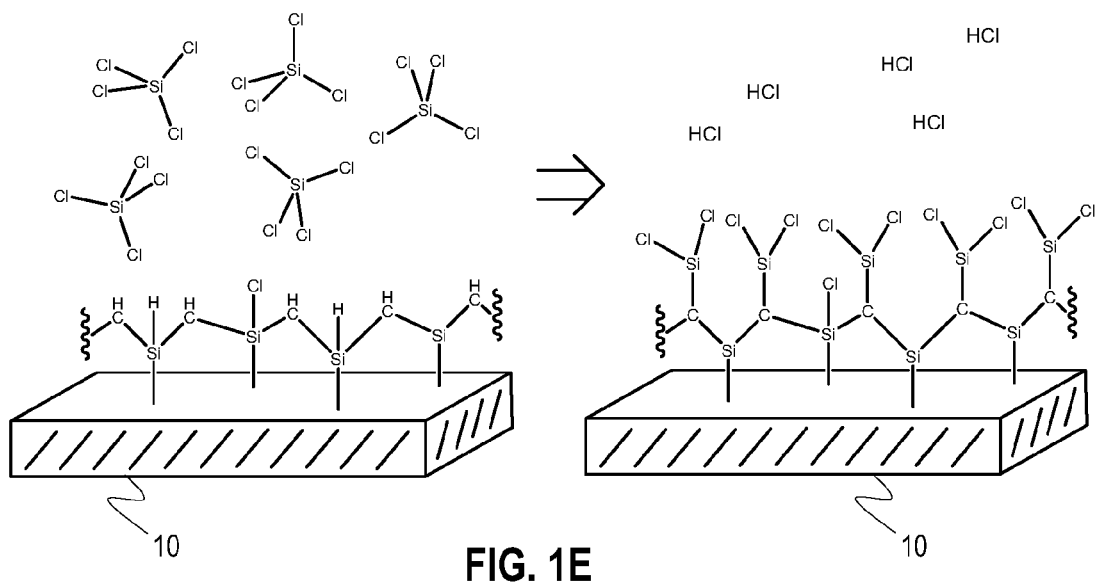

FIG. 1E shows the beginning of a second process cycle in which the Si—C—Si/Si—C—H surface in FIG. 1D is exposed to SiCl$_4$ (or other suitable silicon-containing reactant gas as described above), resulting in a silicon chloride terminated surface and generation of HCl as a byproduct. Stated another way, the resulting silicon-C/CH groups/surface can react with silicon tetrachloride. This may be described as sigma bond metathesis type reactions to form Si—C bonds with the existing surface and forming hydrogen chloride gas as a byproduct.

The time interval for the pulse of the reactants can be varied depending upon a number of factors such as, for example, the volume capacity of the processing chamber employed, the vacuum system coupled thereto and the volatility/reactivity of the reactants used during the ALD process. For example, a large-volume processing chamber requires a longer time to stabilize the process conditions such as, for example, carrier/purge gas flow and temperature, requiring a longer pulse time. A lower flow rate for the reactant gas may also lead to a longer time to stabilize the process conditions requiring a longer pulse time. A lower chamber pressure can result in the reactant gas being evacuated from the processing chamber more quickly requiring a longer pulse time. In general, the process conditions are advantageously selected so that a pulse of the precursor reactant gas has a sufficient amount of reactant so that at least a monolayer of the reactant is adsorbed on the substrate.

The time interval for each of the pulses of the silicon-containing reactant gas (e.g., silicon tetrachloride reactant) and the aluminum containing reactant gas (e.g., TMA reactant) may have the same duration. That is, the duration of the pulse of the silicon tetrachloride reactant may be identical to the duration of the pulse of the TMA reactant gas. Alternatively, the time interval for each of the pulses of the silicon tetrachloride reactant and the TMA reactant may have different durations. That is, the duration of the pulse of the silicon tetrachloride reactant may be shorter or longer than the duration of the pulse of the TMA reactant.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method for forming a silicon carbide material on a substrate surface comprising:
exposing a substrate sequentially to a first reactant gas of the formula $Si_nH_aX_b$ wherein n=1-5, a+b=2n+2, a>0 and X=F, Cl, Br, I; and second reactant gas of the formula $MR_{3-b}Y_b$, wherein M is an element selected from Group III or Group IIIb of the period table, R is a hydrocarbon containing substituent, Y is a halide, hydride or other ligand and b=1-3, to form a silicon carbide layer containing excess hydrogen on the substrate during an atomic layer deposition process;
exposing the substrate having the silicon carbide layer to a treatment process to remove at least some of the excess hydrogen; and
repeating sequentially the atomic layer deposition process and the treatment process.

2. The method of claim 1, wherein the treatment process includes a heat treatment process, and the atomic layer deposition process and treatment process are conducted below 600° C.

3. The method of claim 1, wherein the treatment process includes a plasma treatment process, and the atomic layer deposition process and treatment process are conducted below 600° C.

4. A method for forming a silicon carbide material on a substrate surface, comprising:
exposing a substrate sequentially to a silicon tetrachloride reactant gas and a trimethylaluminum (TMA) reactant gas to form a silicon carbide layer on the substrate during an atomic layer deposition process;
exposing the silicon carbide layer to at least one of a heat treatment and a plasma during a treatment process; and
repeating sequentially the atomic layer deposition process and the treatment.

5. The method of claim 4, further comprising exposing the substrate to a purge gas during a purge process.

6. The method of claim 4, wherein the purge process is conducted after exposure of the substrate to the silicon tetrachloride reactant gas, exposure of the substrate to the TMA reactant gas, and the treatment process.

7. The method of claim 6, wherein the purge gas is selected from an inert gas.

8. The method of claim 7, wherein the purge gas is selected from nitrogen, argon and combinations thereof.

9. The method of claim 6, wherein the plasma comprises one of a hydrogen plasma, a nitrogen plasma and an argon plasma.

10. The method of claim 9, wherein the atomic layer deposition process is performed in a process chamber and the plasma is generated remotely from the process chamber.

11. The method of claim 9, wherein a single process cycle comprises:
exposing a substrate to the silicon tetrachloride reactant gas;
a first purge process after exposing the substrate to the silicon tetrachloride reactant gas;
exposing the substrate to the TMA reactant gas to form a silicon carbide layer on the substrate;
a second purge process after exposing the substrate to the TMA reactant gas; and
the treatment process.

12. The method of claim 11, comprising repeating the single process cycle.

13. The method of claim 4, further comprising, prior to the atomic layer deposition process, treating the substrate to provide an active site on the substrate.

14. A method of forming a silicon carbide material on a substrate surface, comprising:
(a) disposing a substrate within a process chamber;
(b) flowing silicon tetrachloride gas to substrate within the chamber under conditions which form a monolayer on the substrate, the monolayer comprising silicon terminated with chlorine;
(c) purging the process chamber;
(d) flowing trimethylaluminum (TMA) gas to the substrate under conditions in which methyl groups exchange with chlorine and to provide a hydrogen rich layer;
(e) purging the process chamber;
(f) exposing the substrate to at least one of a heat treatment and a plasma treatment to reduce hydrogen in the hydrogen rich layer;
(g) purging the process chamber; and
(h) repeating steps (b) through (g).

15. The method of claim 14, wherein the plasma is formed remotely from the process chamber.

16. The method of claim 15, wherein the plasma is hydrogen plasma or an inert gas plasma.

17. The method of claim 16, wherein the inert gas selected from nitrogen and argon.

18. The method of claim 16, wherein the purge gas comprises an inert gas.

19. The method of claim 14, wherein the temperature of the process is maintained below 600° C.

20. The method of claim 14, wherein the temperature of the process is maintained below 400° C.

* * * * *